US009714800B1

(12) United States Patent
Lasko et al.

(10) Patent No.: US 9,714,800 B1
(45) Date of Patent: Jul. 25, 2017

(54) MATERIALS HAVING TWO SURFACES WITH DIFFERENT COEFFICIENTS OF THERMAL EXPANSION

(71) Applicant: Mainstream Engineering Corporation, Rockledge, FL (US)

(72) Inventors: Thomas M. Lasko, Melbourne, FL (US); Ted J. Amundsen, Melbourne, FL (US); Justin J. Hill, Merritt Island, FL (US)

(*) Notice: Subject to any disclaimer, the term of this patent is extended or adjusted under 35 U.S.C. 154(b) by 0 days.

(21) Appl. No.: 14/983,728

(22) Filed: Dec. 30, 2015

Related U.S. Application Data

(62) Division of application No. 13/865,689, filed on Apr. 18, 2013, now Pat. No. 9,328,976.

(51) Int. Cl.
| | |
|---|---|
| *F28F 21/08* | (2006.01) |
| *B23P 15/26* | (2006.01) |
| *B32B 5/14* | (2006.01) |
| *C22C 26/00* | (2006.01) |
| *C22B 9/22* | (2006.01) |
| *H01J 37/317* | (2006.01) |
| *H01L 23/373* | (2006.01) |
| *B23K 15/00* | (2006.01) |
| *B32B 5/02* | (2006.01) |
| *F28F 3/02* | (2006.01) |

(52) U.S. Cl.
CPC ............ *F28F 21/089* (2013.01); *B23K 15/00* (2013.01); *B23P 15/26* (2013.01); *B32B 5/145* (2013.01); *B32B 5/147* (2013.01); *C22B 9/228* (2013.01); *C22C 26/00* (2013.01); *H01J 37/317* (2013.01); *H01L 23/3732* (2013.01); *B32B 5/02* (2013.01); *C22C 2026/008* (2013.01); *F28F 3/02* (2013.01); *F28F 21/085* (2013.01); *Y10T 29/4935* (2015.01); *Y10T 428/12007* (2015.01)

(58) Field of Classification Search
CPC ........ F28F 21/08; F28F 21/085; F28F 21/086; F28F 21/089; H01S 1/005; H01S 3/0903; H01L 21/4871; B23P 15/26; B23P 2700/10; B21D 53/02; G21K 5/04; H01J 37/305; H01J 37/3053; H01J 37/3056; H01J 37/31; H01J 37/315; H01J 37/317; H01J 29/46–29/467; C22B 9/22; C22B 9/228; B23K 15/00; C22C 9/00; C22C 26/00; C22C 2026/008; B22F 7/00; B22F 7/02; B32B 5/00; B32B 5/02; B32B 5/04; B32B 5/14; B32B 5/142; B32B 5/145; B32B 5/147; B32B 5/16; B32B 5/22; Y10T 428/12021; Y10T 428/12028; Y10T 428/12056; Y10T 29/4935; Y10T 29/49353; Y10T 29/4998; Y10T 29/49982
See application file for complete search history.

(56) References Cited

U.S. PATENT DOCUMENTS

| | | | |
|---|---|---|---|
| 2,103,303 A | 3/1936 | Steenbeck | |
| 2,394,037 A * | 2/1946 | Brecht | B61C 9/30 |
| | | | 105/38 |
| 2,680,815 A | 6/1954 | Burrill | |
| 4,189,686 A | 2/1980 | Brau et al. | |
| 4,348,263 A * | 9/1982 | Draper | C25D 5/34 |
| | | | 148/DIG. 93 |
| 5,045,972 A | 9/1991 | Supan et al. | |
| 5,154,945 A * | 10/1992 | Baldwin | C23C 16/483 |
| | | | 423/446 |
| 5,236,545 A * | 8/1993 | Pryor | C30B 25/02 |
| | | | 117/929 |
| 5,260,106 A * | 11/1993 | Kawarada | C23C 16/0272 |
| | | | 117/91 |
| 5,731,046 A * | 3/1998 | Mistry | B23K 26/0604 |
| | | | 427/249.7 |
| 6,987,318 B2 | 1/2006 | Sung | |
| 7,768,120 B2 * | 8/2010 | Takashima | H01S 5/02492 |
| | | | 257/706 |
| 7,884,321 B2 * | 2/2011 | deCecco | H03F 1/26 |
| | | | 250/305 |
| 9,101,979 B2 * | 8/2015 | Hofmann | B32B 15/01 |
| 9,156,058 B2 * | 10/2015 | Brandl | B22F 3/1055 |
| 2012/0181456 A1 * | 7/2012 | Chen | G21K 1/087 |
| | | | 250/492.3 |
| 2012/0207264 A1 * | 8/2012 | Van Den Berghe | G21C 3/60 |
| | | | 376/414 |

FOREIGN PATENT DOCUMENTS

DE   WO 2012083922 A1 *  6/2012 ............ B22F 3/1055

OTHER PUBLICATIONS

Sergey V. Kidalov and Fedor M. Shakhov, Thermal Conductivity of Diamond Composites, Dec. 21, 2009, Materials, ISSN 1996-1944, "www.mdpi.com/journal/materials" or "www.mdpi.com/1996-1944/2/4/2467/pdf", pp. 2467-2495.*
Bosley, W., The Betatron, Journal of Scientific Instruments 1946, 23 (12), 277.

* cited by examiner

*Primary Examiner* — Sarang Afzali

(57) ABSTRACT

A body comprising at least two components having one or more different properties and a method of producing the same are disclosed. One of the body components is in the form of particles with optional adhesive interlayers. A second of the components has a surface locally melted in a predetermined pattern and only to a predetermined depth by scanning an electron beam there across to incorporate the particles and form a metal composite film. Thereby, a predetermined volumetric concentration of the incorporated particles varies continuously from the locally melted surface so as to provide two surfaces in the body having different coefficients of thermal expansion.

5 Claims, 7 Drawing Sheets

| | Superconducting | Non-Superconducting | Units |
|---|---|---|---|
| Accelerating Voltage | 1-5 | 1-5 | MeV |
| Beam Width | 1-150 | 1-150 | µm |
| Beam Length | 5-15 | 5-15 | cm |
| Beam Current | 0.5-3.5 | 1.5-20 | mA |
| Peak Power | 3-5 | 5-20 | kW |
| Average Power | 3-5 | 0.1-1 | kW |
| Max Surface Temp. | 1500-2000 | 1500-3000 | K |
| Process Speed | 5-300 | 3-150 | mm$^3$/s |

FIG. 7

MATERIALS HAVING TWO SURFACES WITH DIFFERENT COEFFICIENTS OF THERMAL EXPANSION

CROSS-REFERENCE TO RELATED APPLICATION

This application is a divisional application of U.S. patent application Ser. No. 13/865,689, filed Apr. 18, 2013, now U.S. Pat. No. 9,328,976, issued May 3, 2016, the entire disclosure of which is expressly incorporated by reference in its entirety.

BACKGROUND AND SUMMARY OF THE INVENTION

The present invention relates generally to novel materials whose surface and subsurface have been modified along with their properties within this surface/subsurface region, using electron beams that are coupled with normal conducting or superconducting linear accelerators (defined heretofore and referred to herein as an "Ebeam-LINAC" or "Ebeam-LINACs"). Due to the efficient and rapid transfer of energy into a material's surface and subsurface with an electron beam, heating, thermal processing, electric field induced effects or X-ray irradiation (and their respective modifications) can be localized within a material. The depth and volume of this treatment is specified by the beam parameters: accelerating voltage, probe current and probe area. Therefore, the overall surface/subsurface geometry in which the modification occurs can be tightly controlled. Furthermore, the transfer function between electron energy and energy imparted to the predefined surface/subsurface volume can approach unity, making the process highly efficient. Especially in the case of material thermal processing with Ebeam-LINACs, the rate of thermal energy delivered to the surface/subsurface can be greater that the rate of heat conduction within the material; allowing for hierarchical alterations to the work-piece which alters the surface/subsurface to a predefined thickness and leaves the substrate unaltered.

The concept for Ebeam-LINACs was first introduced as the Betatron in the 1940's. See, e.g., U.S. Pat. No. 2,394,037. Other than fundamental research into the device which improves either the electron gun or linear accelerator, the dominant use of Ebeam-LINACs has been the generation of free-electron lasers as disclosed in U.S. Pat. No. 4,189,686, and in medical applications as described in Bosley, W., The Betatron. *Journal of Scientific Instruments* 1946, 23 (12), 277, in a laboratory setting with high power instruments or sterilization with low power instruments as disclosed in U.S. Pat. No. 2,680,815. Only recently have high-power Ebeam-LINACs become a viable option for unique materials processing due to reductions in system size, power consumption and cost.

The ability of the Ebeam-LINAC to precisely deliver energy to a prescribed volume of material is unique, and we have recognized there are a substantial number of materials-processing operations now possible. As a way to succinctly illustrate the principles of the present invention and its advantages, the following discussion compares thermal material processing with Ebeam-LINACs; specifically with respect to the production of copper-diamond, and, more specifically, the production of heat spreaders with a variable through-thickness coefficient of thermal expansion. The present invention contemplates other materials that can be processed through secondary X-ray generation/irradiation or electric field induced effects within those materials.

An Ebeam-LINAC of conventional construction generally is composed of several items; one to generate and direct the electron beam (Ebeam gun), a cavity to accelerate the directed electron beam (LINAC), several apertures and magnetic lenses to collimate, focus and steer the beam, and either an in-vacuum sample platen or a electron window to process the sample/work-piece outside of vacuum. Such an Ebeam-LINAC is schematically depicted in FIG. 1 in relation to a workpiece to be processed. As is well known, a vacuum pump and cryogenic cooling systems are also required to maintain vacuum (the area defined by dotted lines) within the Ebeam-LINAC and to dissipate the heat load generated within the LINAC. In the case of thermal processing, the near-relativistic electrons are directed to the workpiece and bombard the surface/subsurface thereof, thereby generating both heat and radiation from scattering events. The amount of heat that is generated generally depends on the beam current and the depth to which this heat is delivered below the surface depends on the accelerating voltage. Using the magnetic lens to spread and raster the beam across the surface allows for a large area to be processed in a short time period. Especially at high accelerating voltages, the material subsurface processing depth can exceed several millimeters, depending on the atomic mass of the material. This type of energy delivery to the material is both rapid and efficient with nearly 100% of the electron energy being imparted to the material. In contrast, conventional thermal processing by contact, convection or irradiation heating is slow, and a large amount of energy is lost to the surroundings or to heat up the instrument itself. These known methods do not allow for simultaneous heating of both the workpiece material's surface and subsurface, especially with any degree of control with respect to subsurface processed depth. Furthermore, laser irradiation often generates plasma that reflects light. Plasma is also generated with Ebeam irradiation, but the plasma is transparent to electrons so that the thermal processing can continue uninhibited. High energy Ebeam-LINACs are now commercially available from Niowave Inc. in Lansing, Mich., Radiabeam Technologies in Santa Monica Calif. and Advanced Energy Systems, Inc in New Jersey and New York.

Copper-diamond heat spreaders have traditionally been synthesized using conventional thermal processing methods, the most common of which are described in U.S. Pat. No. 5,045,972. To briefly summarize these, the composite can be made by the sintering of a pressure-consolidated matrix of diamond and metal particles or by the melt-infiltration of a consolidated diamond matrix with molten metal. Both of these methods involve heating the bulk material up to above the melting point of the metal and are very energetically inefficient. Additionally, these methods do not provide a practical way for creating a material with a gradient in diamond concentration, i.e., a "tunable" gradient which facilitates more control over the coefficient of thermal expansion (CTE) to ensure materials compatibility at all interfaces. The only approach that we have found described in the prior art to have a gradient in composition is described in U.S. Pat. No. 6,987,318. in which multiple diamond sizes are used to tune the thermal conductivity of the sample so that less expensive diamonds can be used further away from the hot interface. These materials are made similar to those conventional ways described above. No mention is made or even suggested of controlling the CTE of the resulting heat spreader.

The present invention creates a gradient in diamond composition without the need for multiple sizes of diamond or inefficient bulk thermal processing. The gradient in our invention will be used not only for thermal conductivity modulation as in the prior art, but to tune or control the CTE of the material to ensure materials compatibility.

As the power density of electronic devices grows, the need for innovative cooling solutions increases. Many high-power devices require advanced thermal control systems in order to operate. However, the heat flux at the device level often exceeds the capabilities of modern cooling techniques. For example, the heat flux of a high-power laser can exceed 2000 W/cm$^2$ at the device level, but this exceeds the critical heat flux of modern refrigerants. Therefore, a heat spreader is necessary to diminish the heat flux to an acceptable level.

The effectiveness of a heat spreader is determined by its thermal conductivity, and to a certain extent, its thickness. Materials with high thermal conductivity such as copper are generally used. For example, FIG. 2 shows a typical setup for cooling a heat-generating device 101. This device is mounted on top of a heat spreader 103, separated by a thermal interface layer 102. The heat spreader 103 is mounted on top of the heat sink 105, separated by another thermal interface layer 104.

The other important property of a heat spreader is its coefficient of thermal expansion (CTE). Due to the large temperature differences between the heat source and heat sink, the materials involved can undergo significant expansion. At each interface between dissimilar materials, stresses are induced proportional to the difference in CTE values. Depending on the amount of stress induced, the device can fail or separate from the heat spreader.

Usually, the heat spreader is composed of a homogeneous material that is selected to minimize the effect of expansion. However, a material with a "tunable" through-thickness CTE is even more beneficial. Each surface can then be tuned to the adjacent mounting surface, eliminating thermal expansion problem altogether. Accordingly, it is an object of the present invention to produce a heat spreader with a different CTE at the top and bottom surfaces via a predetermined composition gradient therebetween.

Several methods exist for processing materials to improve properties in the bulk material or on one or more surfaces or regions of the material. Some of these are mechanical, such as work hardening. Some processes, such as polymerization, involve chemical reactions that change the structure or composition of the material. Other processes, like electroplating and anodizing, are electrical means of improving material properties.

Many types of thermal processes exist for enacting surface or bulk changes. These can be classified into the three heating methods previously mentioned, namely convection, surface heating, and internal energy generation.

Convection processes rely on transferring thermal energy from a fluid to a solid, such as in a furnace or oven. This typical heat treating process is not ideally suited for surface modifications, especially in metals. Since the thermal conductivity (k) is high and the heat transfer coefficient (h) is low, the Biot number (Bi) is very small, especially for bodies that have a small characteristic length ($L_c$):

$$Bi = \frac{hL_c}{k}$$

For Bi<<1, thermal gradients are small, and therefore localized heating is very difficult. For example, a 50 mm×50 mm×5 mm copper heat spreader heated in a furnace would have a Biot number of =0.000026, indicating that thermal gradients throughout the copper would be negligible.

Thermal processing via surface heat flux or internal heat generation does not rely on the convection heat transfer coefficient (h) for depositing energy. Instead, the value of h describes the amount of heat lost due to convection on all of the exposed faces of the body. However, for the same Biot number, the problem of generating a temperature gradient still remains. In order to generate localized heating, the energy deposition rate must be much higher than the amount conducted away via thermal diffusion.

A surface heat flux can be generated in any one or more of several ways: open flame, heater in physical contact with surface, laser, radiation, etc. In all cases, however, there are drawbacks. One of the main issues is efficiency at least for some of these methods. For example, an open flame loses a considerable amount of thermal energy to the surrounding environment, as a result of which only a fraction of the energy actually gets transferred to the body.

Another issue is that a surface heat flux, by definition, requires all thermal energy to pass through the outer boundary of the body. In order to heat any portion of the interior, the surface must get hotter. This can be a problem for certain applications. For example, in order to melt a region below the surface of a copper block, the copper at the surface must be even hotter. It is possible that the surface copper will vaporize before a sufficient amount of penetration depth is achieved.

Heating via internal energy generation overcomes these issues. The most common method of internal energy generation in metals is through resistive heating which provides a relatively uniform volumetric heating throughout the whole body. In this situation, the problem is the opposite of uniform heat flux in that penetration depth is not an issue but local heating is an issue. In order for this method to provide local heating, different regions of the body must be electrically isolated.

Electron beam heating is optimal for localized heating. The internal energy generation is localized to a region, and the size of the region depends on the beam parameters, including accelerating voltage and beam diameter, and the properties of the target material. Unlike resistive heating, the energy generation is not uniform and is limited to a region adjacent to the surface regardless of electrical conductivity. Electron beams can deliver a large amount of thermal energy in a small region with efficiencies of greater than 90%, making it an optimal solution for the production of copper diamond composite films.

The present invention relates to any metal composite consisting of at least two components with different properties, with the volumetric fraction of each component varying in some direction through the body of the composite for the purpose of exploiting the advantageous physical properties at one or more surfaces. A copper diamond composite heat spreader will be used for exemplary purposes, although it will be apparent that the present invention also applies to other compositions, configurations, and geometries.

More specifically, the present invention relates to a configuration consisting of a copper substrate with embedded diamond particles that the volumetric concentration of diamond is highest at one surface and varies continuously along its thickness, creating two distinct surfaces with different coefficients of thermal expansion. One surface is designed to match the CTE of a heat source such as a silicon chip (with low CTE) and another surface to match the CTE of a heat sink (with high CTE). This minimizes the possibility of separation between any two components due to the thermal stress induced at the interface. Therefore, the overall heat transfer is improved with a heat spreader without sacrificing system reliability. While this is the currently preferred embodiment, the present invention can be applied to different materials and different physical properties as above noted.

The present invention also relates to a method of producing a copper diamond composite through sintering with an electron beam as the energy source. The electron beam is scanned across the surface of the body, melting a small region near the surface as the beam moves. The rate at which the energy is deposited exceeds the rate of conduction away from the region, allowing the copper at sufficient depth from the surface to remain below the melting point. The local melting allows, for example, the copper diamond film to be sintered directly on a copper heat sink without actually melting the heat sink. This is advantageous because a thermal interface layer between the heat spreader and heat sink is unnecessary. In addition, the local melting preserves the spatial variation in diamond concentration, thereby not allowing particles to flow in the melted copper.

The present invention also is directed to a method for modeling and simulating the performance of an electron beam in this application in order to select proper beam parameters for producing a copper diamond composite. The method uses Monte Carlo electron trajectory simulations to predict the energy deposition profile in the target material and converts these to an axisymmetric transient thermal model to predict temperature profiles. Using these results, calculations can be performed to predict beam parameters and process time required to fabricate the composite. We contemplate that these methods will be applied as well to other electron beam applications using different materials or processes. Use of the methods described herein will result in a substantial reduction in the time and effort in both resources and computational effort to select appropriate electron beam parameters.

Therefore, in light of the benefits of a copper diamond composite heat spreader, as well as the aforementioned shortcomings in the prior art, this invention has among other things, the following objectives:

To provide a general configuration for a copper diamond composite containing variable diamond content for surface CTE matching;

To provide a method for fabricating said configuration using an electron beam; and To provide a method for selecting appropriate electron beam parameters necessary for producing such a configuration.

BRIEF DESCRIPTION OF THE DRAWINGS

These and other objects, advantages and features of this invention will be apparent from the following specification thereof taken in conjunction with the accompanying drawings in which:

FIG. 7 is a table of example ranges of parameters suitable for processing copper diamond composite for both superconducting and non-superconducting beams;

DETAILED DESCRIPTION OF THE DRAWINGS

The properties of a high thermal conductivity and tunable-CTE heat spreader can be achieved using a copper-diamond film. This results from the fact that copper has a high thermal conductivity (401 W/(m·K)) and a relatively high CTE ($17 \times 10^{6}/°$ C.), while diamond has an extremely high thermal conductivity (2200 W/(m·K)) and a relatively low CTE ($1 \times 10^{-6}/°$ C.).

A copper-diamond film has a very high thermal conductivity and a CTE between that of copper and diamond. The exact thermal conduction is a direct function of the relative quantities of copper and diamond used. Most pure metals and other materials used in thermal control applications, like silicon, have a CTE somewhere in this range. The diamond content can be varied in the film spatially to create a gradient of CTE values. However, up until now, it was not possible to reliably produce such a film using known techniques. The approach can also be used to create other metal-diamond films, such as aluminum-diamond films. It is of course possible to use this localized thermal processing technique with any number and type of materials. Copper-diamond is the example used here due to the extremely high cost of producing materials of this type using conventional approaches and therefore as a means to illustrate the benefits of the this new approach.

We have found that the copper-diamond film can now be produced using electron beam processing in a way that was previously impractical or unachievable. The desired tuned heat spreader can be formed using copper and diamond particles that are put in a cast of a particular shape, and then sintered using an electron beam.

In order for the necessary gradient to be preserved during processing, we have also found that the copper should be melted locally instead of melting the entire piece at once in order to minimize the flow of diamond particles within the copper. The electric field effects of the electron beam will enhance wetting and adhesion of the copper to the diamond particles. Alternatively, adhesive interlayers such as chromium, titanium or other materials can be use to first coat the diamond particles prior to their incorporation into the copper matrix. Our novel method for designing, simulating, and producing a copper diamond composite is demonstrated using the following example.

The first step in the process is to outline all of the design parameters. The properties of the electron beam are: accelerating voltage, scan width, beam angle, and working distance.

These parameters, along with the target material properties and simulation parameters, such as the number of electrons trajectories, are used in a Monte Carlo statistical simulation to predict the most probable trajectories of electrons in the same to be treated and determine backscattering, generation of X-rays, and energy deposition.

Figure 1:
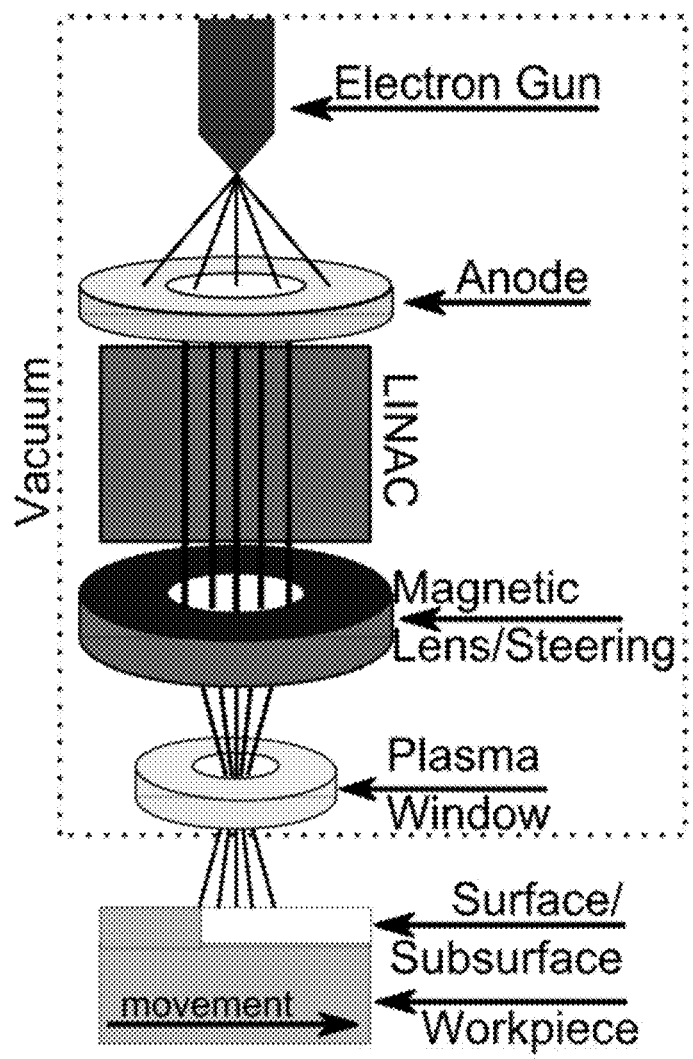
FIG. 1 is a general schematic of a conventional Ebeam-LINAC used to carry out materials processing.
Figure 2:
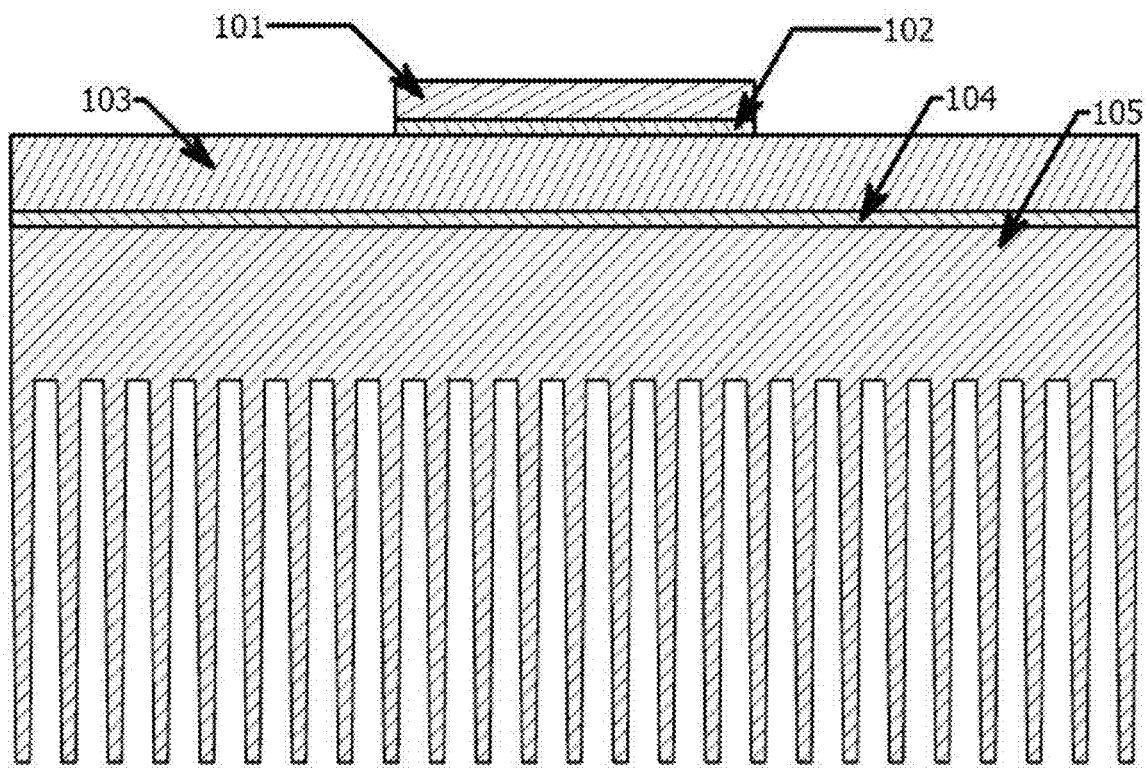
FIG. 2 is a conventional and representative copper heat spreader mounted on finned heat sink.
Figure 3:
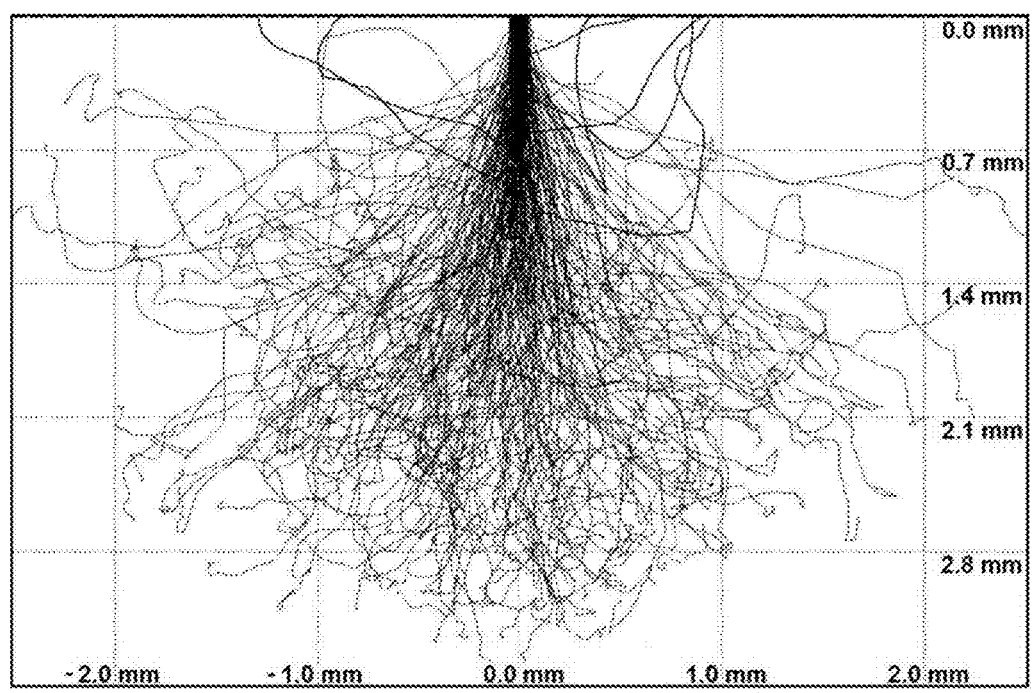
FIG. 3 is a computational plot of the electron trajectories in a copper diamond substrate.

FIG. 3 shows an exemplary simulation of trajectories from a 5 MeV electron beam in copper-diamond substrate target. The simulation consists of 200,000 electron trajectories, only a portion of which are shown. The thin lines show trajectories of electrons that terminate within the target, while the solid lines that originate and terminate at the top edge show the trajectories of electrons that are backscattered. This simulation indicates that the approximate penetration depth of the electron beam is 3 mm.

Figure 4:
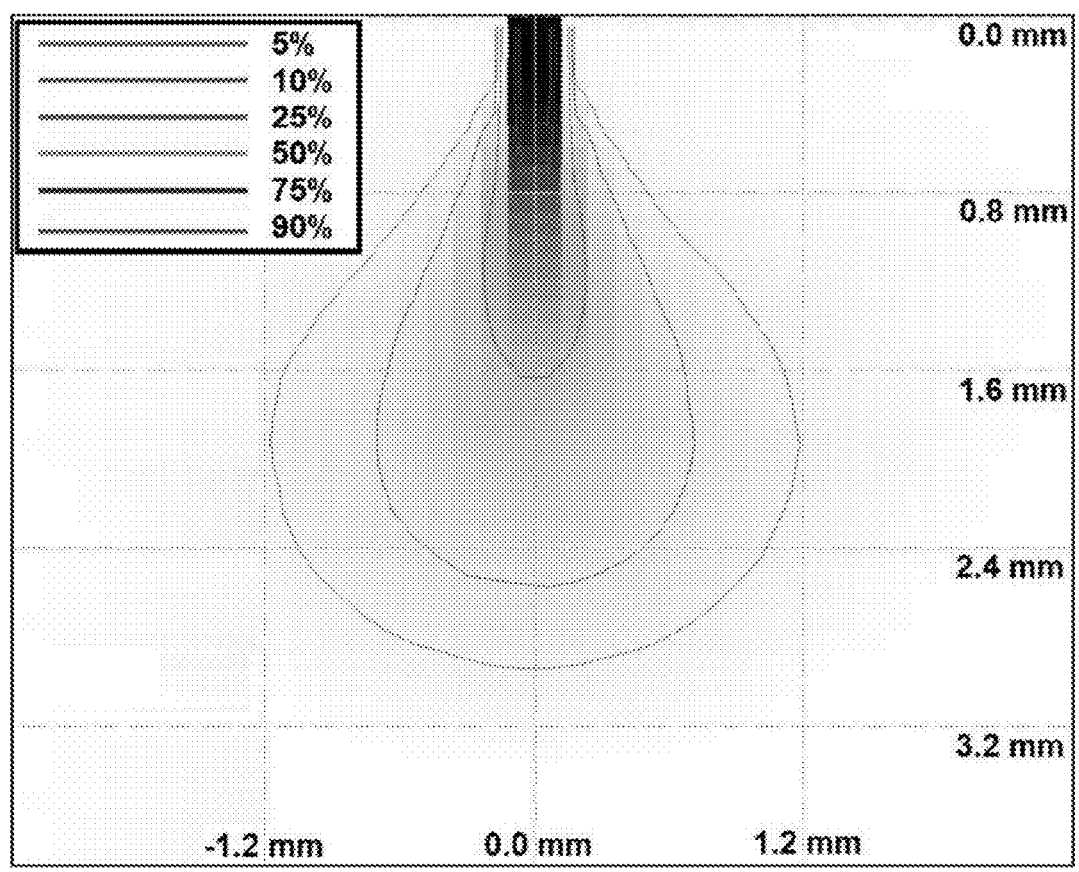
FIG. 4 is a computational plot of the energy deposition profile in a copper diamond substrate.

The energy deposition profile for this example simulation is shown in FIG. 4. The innermost contour represents a region that contains 10% of the total energy deposited by the beam. The outermost contour represents a region that contains 95% of the total energy deposited by the beam.

A Monte Carlo simulation of the trajectories can be used along with a thermal analysis to develop a profile of the energy deposited in the solid as a function of position. This profile is essentially a snapshot in time for an electron beam. Coupling these results with the beam current and the scan rate provides an accurate description of the total amount of energy deposited in the sample over time for a given process.

Figure 5:
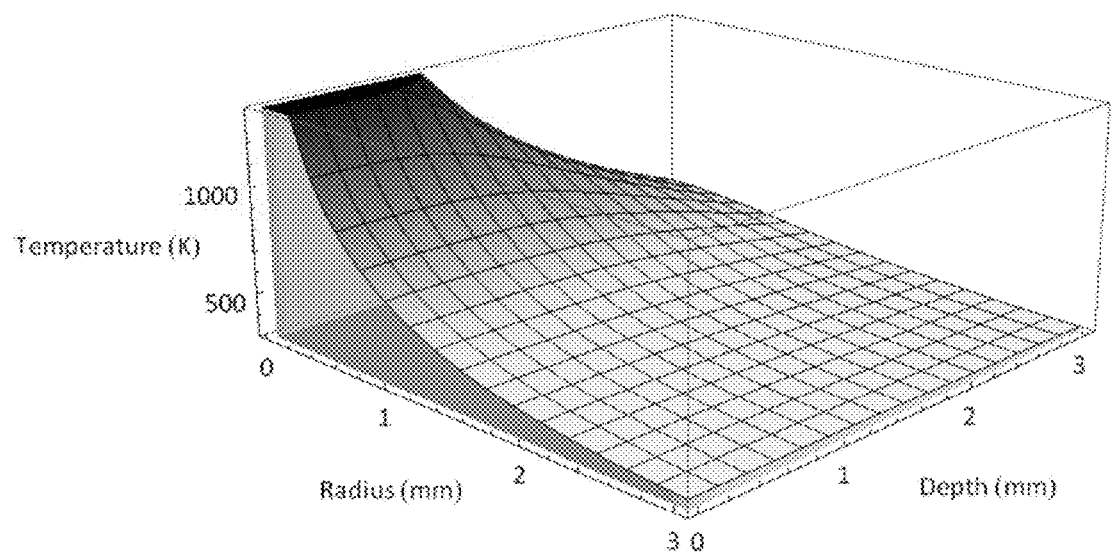
FIG. 5 is an example of the computational prediction of the three-dimensional thermal distribution in a copper-diamond heat spreader showing the melting of copper in desired process region.

As is well known in the art, the thermal analysis of the effect of the E-Beam on the sample can be used to generate plots such as the 3D temperature profile shown in FIG. 5 where higher temperatures are shown both by darker regions and height to provide a graphical representation of temperature gradients. The plot shows the thermal profile for a copper diamond sample with the darkest regions at the plateau representing the region that has melted.

Our method of linking Monte Carlo simulations to thermal models provides a valuable tool for determining the requirements of a specific process. Without linking the two, manual drawing of the geometry would be required, applying heat generation terms for each element, and prescribing boundary conditions for each design case.

The following describes an analysis for the production of a 1.2 mm thick copper heat spreader using electron beam processing. The nominal thickness of 1.2 mm was chosen because it is a typical value for current heat spreader technology.

Figure 6:
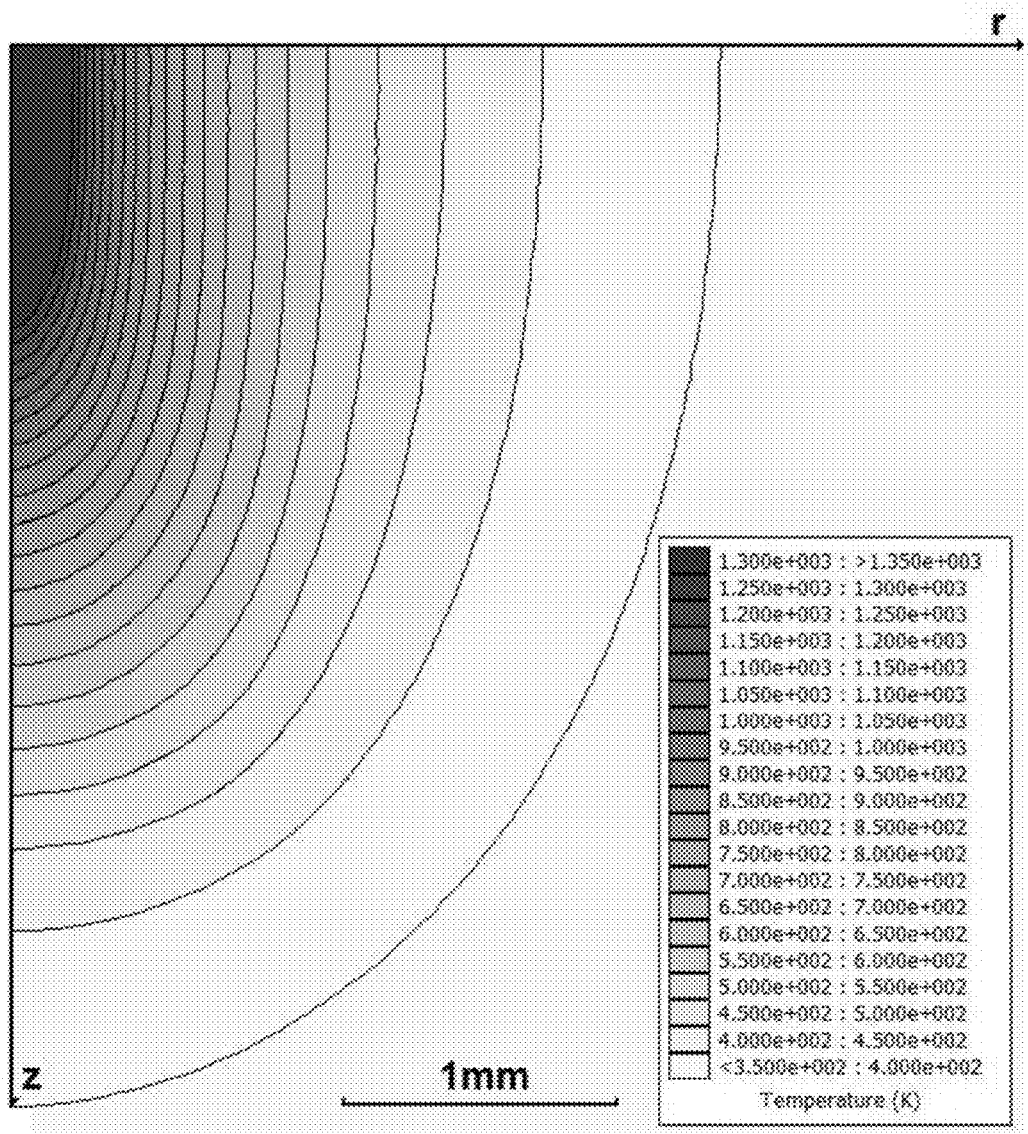
FIG. 6 is an example of the computational prediction of the temperature profile for the process region of a copper diamond substrate.

Using the methods described above, the temperature profile of the process region was obtained and is shown in FIG. 6. The z axis at the left edge of the figure represents the centerline of the beam and is an axis of symmetry, while the r axis represents the radial coordinate. The origin is located at the surface where the beam penetrates the material.

The parameters selected for this process are listed below:

| Substrate Material: | Copper-Diamond |
| --- | --- |
| Accelerating voltage: | 5.0 MeV |
| Beam current: | 1 mA |
| Beam radius: | 0.1 mm |
| Exposure time. | 16 msec |
| Energy deposited: | 4922 keV |
| Power consumption: | 4922 W |
| Processed depth: | 1.2 mm |
| Processing rate: | 20 mm$^2$/sec |

The accelerating voltage of 5 MeV was chosen to match the desired process depth of 1.2 mm. Even though the beam penetrates approximately 3 mm, most of the energy is concentrated near the surface. Therefore, the top 1.2 mm of material will melt regardless of the total depth of the substrate.

The beam radius of 0.1 mm was chosen because it resulted in a process region of approximately 0.5 mm by 0.5 mm, which is appropriate for this size substrate.

The beam current and exposure time were chosen to effectively melt the copper in the process region with the least amount of power. The beam current for this process is 1 mA and the exposure time is 16 msec. The exposure time indicates the amount of time that the beam radiates in a given process region, in this case a 0.5 mm radius. Both of these values are within the capabilities of current electron beam technology.

The energy deposited in the material by the electron beam is 4922 keV, indicating an efficiency of 98.4% for the 5 MeV beam. The process consumes approximately 4922 W of power and the processing rate is 20 square millimeters of surface area of the copper substrate per second. This indicates that a typical heat spreader could be processed in a few minutes at a very high efficiency.

The above described materials processing can be performed by either a normal conducting or superconducting electron beam. The beam parameters depend on the processing rate, intensity and the type of electron beam. Example ranges of parameters suitable for processing copper diamond composite are shown in FIG. 7. Both superconducting and normal conducting electron beams can be modeled and optimized for materials processing applications using a predictive simulation algorithm as above described. The optimal type of electron beam for each application is determined by the trade-offs between capital expenses, operating expenses and throughput.

While we have shown and described a currently preferred embodiment in accordance with our invention, it should be understood that the same is susceptible of other changes and modifications as will now be apparent to one skilled in the art without departing from the spirit of our invention. Therefore, we do not intend to be limited to the details shown and described herein but intend to cover all such changes and modifications as may fall within the scope of the appended claims.

We claim:

1. A metal composite film, comprising a first component and a second component, wherein the first component is comprised of particles, the second component is a metal or metal alloy body, and the particles are distributed on a surface of the metal or metal alloy body and also incorporated within the metal or metal alloy body to a predetermined depth under the surface of the metal or metal alloy body such that a predetermined volumetric concentration of the incorporated particles varies continuously throughout the film from the surface of the body toward an opposite surface of the body so that the film has a tuned gradient of coefficient of thermal expansion values, wherein an electron beam produced by a superconducting linear electron accelerator is moved relative to the surface to locally melt the surface and the predetermined depth under the surface of the metal or metal alloy body to receive the particles.

2. The body of claim 1, wherein the second of the components has a thermal conductivity lower than that of the particles and a higher coefficient of thermal expansion than that of the particles.

3. The body of claim 1, wherein the body is operatively associated with a heat generating device such that the second of the components beyond the predetermined depth is a heat sink.

4. The body of claim 1, wherein the second of the components is comprised of copper or copper alloy, and the incorporated particles are constituted of diamond to form the metal composite film as a copper diamond film.

5. The body of claim 1, wherein the first of the components includes adhesive interlayers that are one of chromium and titanium.

* * * * *